(12) United States Patent
Pancholi et al.

(10) Patent No.: US 11,037,817 B2
(45) Date of Patent: Jun. 15, 2021

(54) APPARATUS WITH MULTI-WAFER BASED DEVICE AND METHOD FOR FORMING SUCH

(71) Applicant: Intel Corporation, Santa Clara, CA (US)

(72) Inventors: Anup Pancholi, Hillsboro, OR (US); Prashant Majhi, San Jose, CA (US); Paul Fischer, Portland, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/475,084

(22) PCT Filed: Mar. 30, 2017

(86) PCT No.: PCT/US2017/025178
§ 371 (c)(1),
(2) Date: Jun. 29, 2019

(87) PCT Pub. No.: WO2018/182648
PCT Pub. Date: Oct. 4, 2018

(65) Prior Publication Data
US 2019/0333803 A1    Oct. 31, 2019

(51) Int. Cl.
H01L 21/762    (2006.01)
H01L 23/522    (2006.01)
H01L 23/00     (2006.01)

(52) U.S. Cl.
CPC .... H01L 21/76251 (2013.01); H01L 23/5226 (2013.01); H01L 24/06 (2013.01); H01L 24/17 (2013.01)

(58) Field of Classification Search
CPC ................... H01L 21/76251; H01L 23/5226
See application file for complete search history.

(56) References Cited

U.S. PATENT DOCUMENTS

| | | | |
|---|---|---|---|
| 2006/0121690 A1 | 6/2006 | Pogge et al. | |
| 2008/0233710 A1 | 9/2008 | Hsu et al. | |
| 2009/0057890 A1 | 3/2009 | Maebashi et al. | |
| 2014/0273347 A1 | 9/2014 | Tseng et al. | |
| 2015/0076649 A1* | 3/2015 | Kim | H01L 27/14689 257/446 |
| 2016/0013160 A1* | 1/2016 | Chun | H01L 25/50 257/751 |

OTHER PUBLICATIONS

International Preliminary Report on Patentability dated Oct. 10, 2019 for PCT Patent Application No. PCT/US2017/025178.
International Search Report and Written Opinion for International Patent Application No. PCT/US2017/025178, dated Nov. 24, 2017.

* cited by examiner

*Primary Examiner* — William A Harriston
(74) *Attorney, Agent, or Firm* — Green, Howard & Mughal LLP

(57) ABSTRACT

An apparatus is provided which comprises: a substrate; one or more active devices adjacent to the substrate; a first set of one or more layers to interconnect the one or more active devices; a second set of one or more layers; and a layer adjacent to one of the layers of the first and second sets, wherein the layer is to bond the one of the layers of the first and second sets.

16 Claims, 7 Drawing Sheets

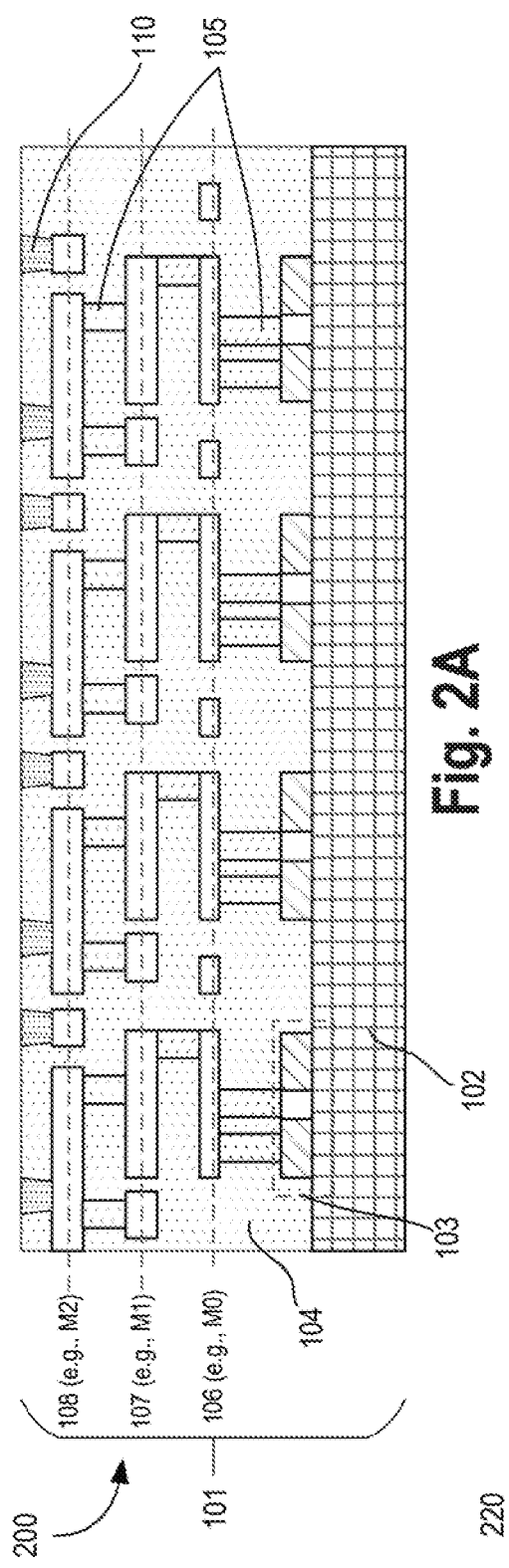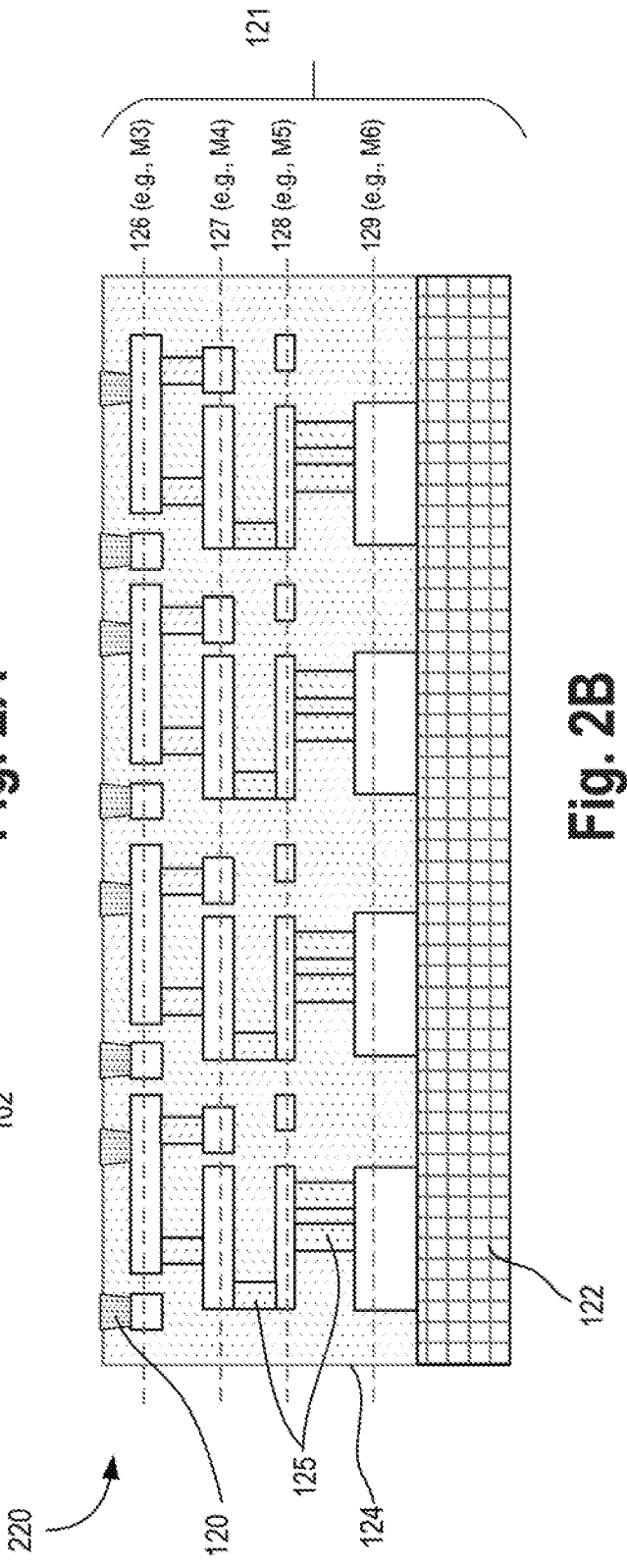

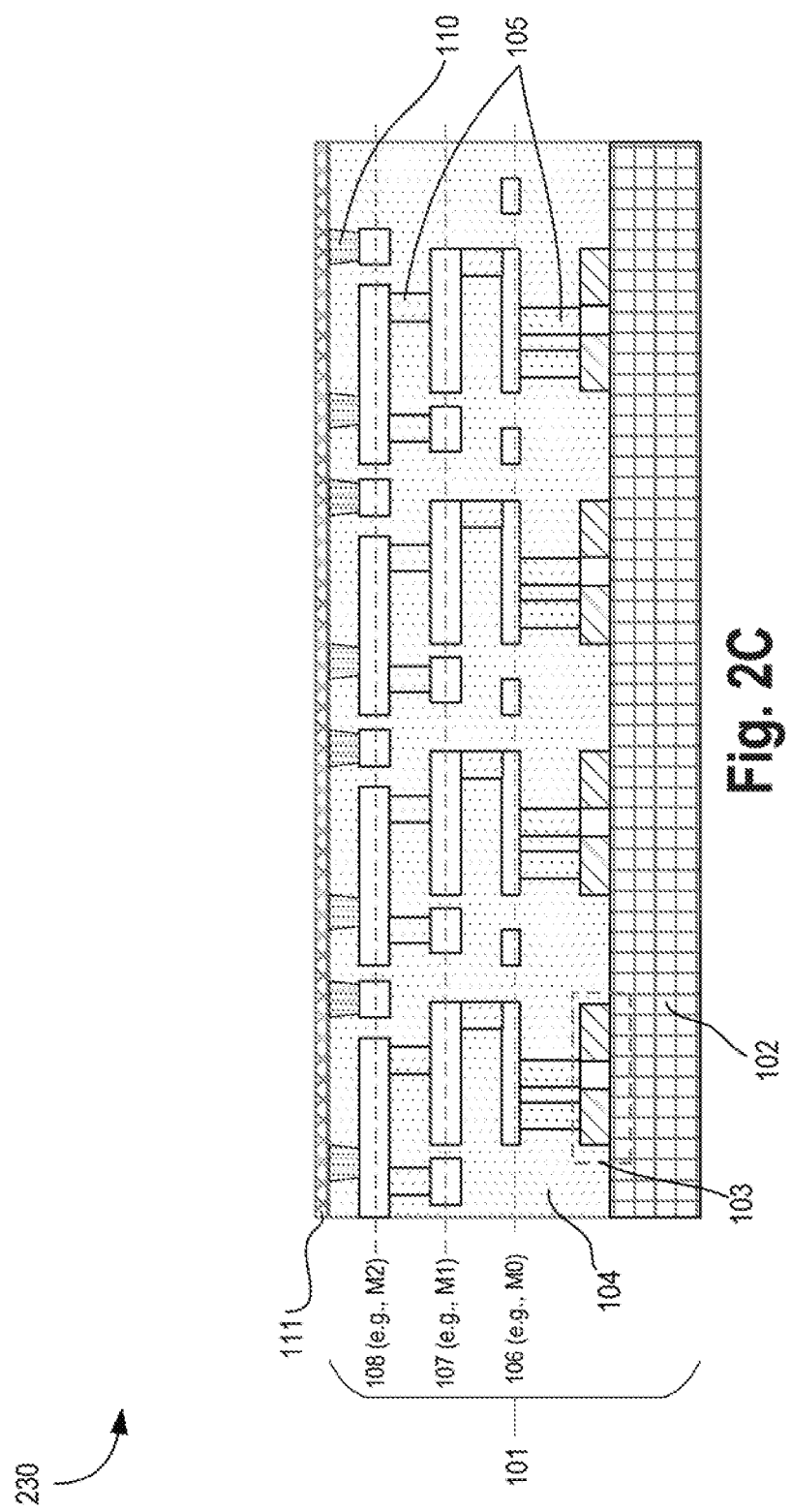

APPARATUS WITH MULTI-WAFER BASED DEVICE AND METHOD FOR FORMING SUCH

CLAIM OF PRIORITY

This Application is a National Stage Entry of, and claims priority to, PCT Application No. PCT/US2017/025178, filed on Mar. 30, 2017 and titled "APPARATUS WITH MULTI-WAFER BASED DEVICE AND METHOD FOR FORMING SUCH," which is incorporated by reference in its entirety for all purposes.

BACKGROUND

Today, manufacturing of semiconductor device starts with a silicon (Si) substrate and progresses with front-end (FE) processes followed by back-end (BE) processes, and finally end-of-life or end-of-line (EOL) processes. As the complexity in device manufacturing is increasing, higher throughput/cycle time in manufacturing has become a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 2A-D illustrate cross-sections of various phases of manufacturing the apparatus, according to some embodiments of the disclosure.

DETAILED DESCRIPTION

Figure 1:
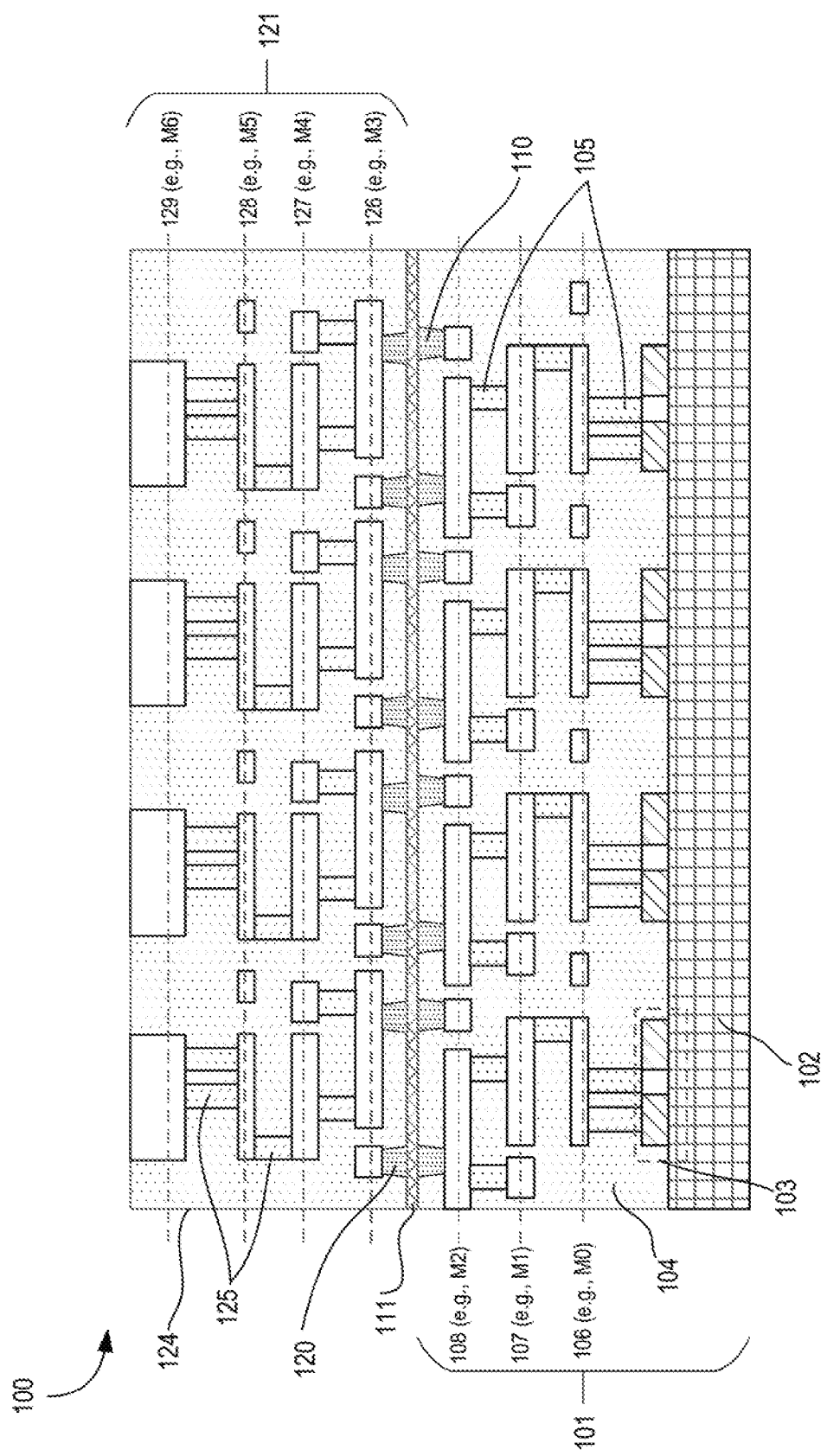
FIG. 1 illustrates a cross-section of an apparatus formed by joining or bonding of two wafers, according to some embodiments of the disclosure.
Figure 2D:
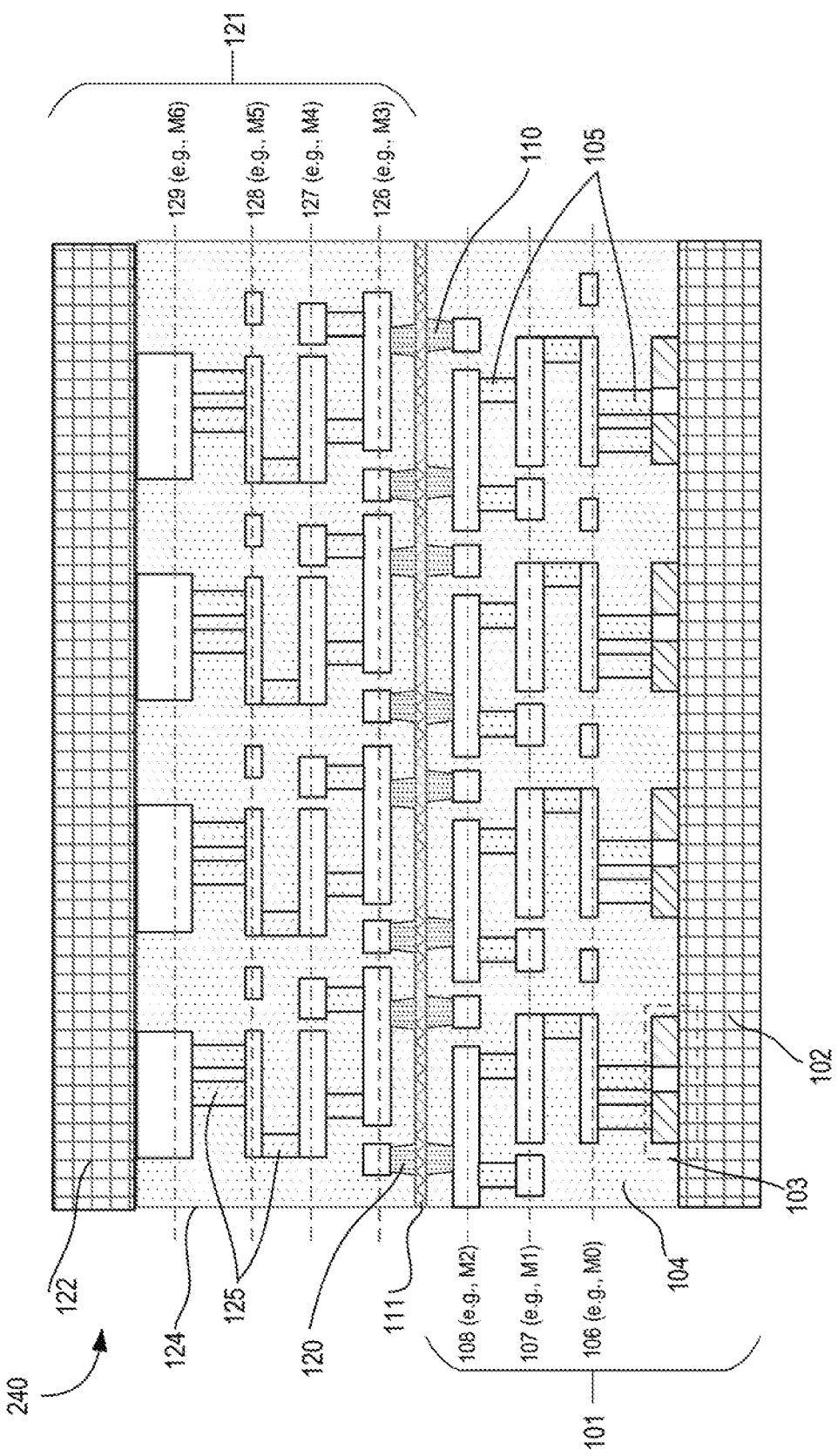

Competitiveness in throughput and cycle time is a concern as it takes a long time from start to end in device manufacturing and hence impacts product to market times in addition to having high development cost. Another constraint with current manufacturing processes is the limitation in BE processes, Current BE processes are developed such that there is no negative impact on the FE structures underneath.

Here, the terms "FE" or "front-end process" refers to a manufacturing process that is used for forming one or more active devices over a substrate. Here, the terms "BE" or "back-end process" refers to a manufacturing process that is used for forming one or more interconnects (e.g., metal layers) to couple the active devices.

Various embodiments describe a chip which is formed by splitting device processing on two substrates (e.g., on two separate wafers). In some embodiments, one substrate of a first wafer can be used for part of one or more devices (e.g., FE process+Mx, where 'M' is a metal layer, and 'x' is a number) and the other substrate of a second wafer can be used for the remaining part of the process (EOL+Mx+1). After that, the two substrate are bonded together and a post bond process is performed to expose end-of-life (EOL) metal interconnect layer/pads to produce the full device for packaging, in according to some embodiments. Here, the terms "EOL" or "end-of-life" or "end-of-line" process refers to a manufacturing process that is used for coupling one or more interconnects to pads that then are coupled to package interconnects (e.g., solder bumps).

In some embodiments, an apparatus is provided which comprises a substrate (e.g., Si); one or more active devices (e.g., transistors) adjacent to the substrate; a first set of one or more layers (e.g., metal 0 (M0), metal 1 (M1), metal 2 (M2), etc.) to interconnect the one or more active devices; a second set of one or more layers (e.g., metal 3 (M3), metal 4 (M4), metal 5 (M5), etc.); and a layer adjacent to one of the layers of the first and second sets, wherein the layer is to bond the one of the layers of the first and second sets, wherein the substrate, the one or more active devices, and the first set of one of more layers are formed on a first wafer, and wherein the second set of one or more layers is formed on a second wafer. In some embodiments, the layer to bond includes at least one of a dielectric or a metal. In some embodiments, the dielectric includes one of: oxygen, carbon-doped oxide, polymer, or glue. In some embodiments, the metal includes one of: Cu, Ni, Co, Al, or W.

Current known solutions have several disadvantages such as high throughput time, high development time and cost, and BE process constraints to minimize impacts to underneath FE processes. The method of forming the device (or apparatus) of various embodiments can use high temperature materials for BE process because the BE process is applied on a different wafer. For example, wafer 2 processing may not impact processing of wafer 1. The manufacturing process of various embodiments have manufacturability advantage and significant throughput advantage.

For example, wafer 1 and wafer 2 can be processed in parallel resulting in yield benefits and shorter development time. In some examples, wafer 2 may not need to be high quality silicon because it is used for providing the structure formed during the BE process. Separating the manufacturing processes on to two different wafers, and then joining or bonding those wafers in a specific manner is referred to here as the split and join process. The split and join process to manufacture a device provides integrated cost of ownership benefit by having a segmented process (e.g., separate process for wafer 1 and wafer 2). Other technical effects will be evident from the various embodiments and figures.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a" "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A. B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-section of apparatus 100 formed by joining or bonding of two wafers, according to some embodiments of the disclosure. In some embodiments, two processed wafers 101 and 121 are joined and then packaged. In some embodiments, wafer 101 comprises substrate 102, active devices 103 transistors), oxide region 104, vias 105, metal layers 106 (e.g., metal 0 (M0)), 107 (e.g., metal 1 (M1)), 108 (e.g., metal 2 (M2)), and wafer connection vias (or regular vias) 110. In some embodiments, substrate 102 includes one of: bulk silicon or silicon-on-insulator (SOI). In some embodiments, the bulk silicon includes device quality Epi.

In some embodiments, wafer 121 comprises water connection vias (or regular vias) 120, oxide region 124, vias 125, metal layers 126 (e.g., metal 3 (M3)), 127 (e.g., metal 4 (M4)), 128 (e.g., metal 5 (M5)), and 129 (e.g., metal 6 (M6)). The various number of metal layers, active devices, and vias in each wafer are shown as an example. Any number of metal layers, active devices, and vias can be used in accordance with some embodiments. In this cross-section, the substrate of wafer 121 is not shown because it is grinded out as discussed with reference to FIGS. 2A-D.

Referring back to FIG. 1, in some embodiments, processing of water 101 is performed separate and independent of processing of wafer 121. In some embodiments, the processing or fabricating technology used to process wafer 101 and wafer 121 is the same. For example, both wafers 101 and 121 are processed using 10 nanometer (nm) CMOS process technology. In some embodiments, the processing or fabricating technology used to process wafer 101 and wafer 121 is different. For example, a newer and more advanced process node technology may be used for processing wafer 101 to produce state of the art transistors and other active devices, while a less expensive process node technology (e.g., a previous generation process technology node technology) may be used for producing wafer 121 which may not have active devices.

In some embodiments, wafer 101 and wafer 121 are bonded or fused together by applying a bonding material 111 such that wafer connection vias 110 and 120 electrical connect with one another. Any suitable apparatus can be used for bonding wafer 101 and wafer 121. In some embodiments, bonding material 111 or layer 111 includes at least one of a dielectric or a metal. In some embodiments, the dielectric includes one of: oxygen, carbon-doped oxide, polymer, or glue. In some embodiments, the metal includes one of: Cu, Ni, Co, Al, or W.

In various embodiments, the processing operation to wafer 1 are FE processing which includes forming active devices on substrate 102 and metal layers closer to active devices (e.g., M0-M2). In some embodiments, the processing operation to wafer 2 are BE and EOL processing which include forming metal layers (e.g., M3-M6) and their associated vias that continue above the metal layers processed or fabricated on wafer 1 and all the way to layers used to connect to package bumps.

While the various embodiments show the bonding of two wafers, a number of wafers can be bonded on top of one another such that each wafer (at least one of them) is fabricated or formed in parallel or independent from the other wafer. As such, as stack of processed wafers can be bonded forming an apparatus or integrated chip in much shorter time resulting in high fabrication throughput.

FIGS. 2A-D illustrate cross-sections 200, 220, 230, and 240, respectively, of various phases of manufacturing the apparatus, according to some embodiments of the disclosure. It is pointed out that those elements of FIGS. 2A-D having the same reference numbers (or names) as the elements of any other figure can operate or function in any manner similar to that described, but are not limited to such.

In some embodiments, cross-section 200 illustrates a portion of wafer 101 after active devices 103 are formed on substrate 102, and including layers that are part of FE processing (e.g., initial metal layers that are closer in proximity to the active device 103 than to the package bumps).

In some embodiments, cross-section 220 illustrates a portion of wafer 121 after layers that are part of BE processing and EOL processing are added on substrate 122 (e.g., Si, bulk Si including device quality Epi. or SOI) In some embodiments, after substrate 122 is prepared for further processing, metal layer that is used in the EOL processing is first deposited and then patterned according to pitch requirements of package bumps. This patterned metal layer which is directly adjacent to substrate 122 is used for connecting the bonded apparatus 100 to a package, in accordance with some embodiments.

In some embodiments, the deposition and processing of layers is reversed compared to traditional wafer processing. For example, EOL processing steps are performed first after a substrate is made ready and then BE processing is performed such that the top layer (here, the layer forming connecting vias 120) is fabricated. In some embodiments, the layer forming the top layer 120 may be part of a FE processing operation.

In some embodiments, cross-section 230 illustrates a portion of wafer 101 after bonding layer 111 is applied. However, the application of bonding layer is not limited to wafer 101. In some embodiments, bonding layer 111 may be applied to wafer 101 and/or wafer 121. In some embodiments, before bonding layer 111 is applied, the surface of the wafers 121 and 101 are prepared for receiving bonding material forming bonding layer 111. For example, the surfaces of wafers 121 and 101 are grinded, etched, and/or polished before bonding material forming bonding layer 111 is deposited.

In some embodiments, cross-section 240 illustrates a portion of a process after wafer 101 and wafer 121 are fused, bonded, attached together such that substrates 102 and 122 are along opposite ends of the stack of layers. In some embodiments, after wafer 101 and wafer 121 are bonded, substrate 122 of wafer 121 is removed to expose the EOL pad structures. For example, substrate 122 is grinded, chemical mechanical planarization (CMP) is applied, and/or dry etching process is applied to expose the EOL patterned metal that was deposited on substrate 122. Cross-section 100 describes the apparatus or portion of the process after substrate 122 is removed, in accordance with some embodiments.

Figure 3:
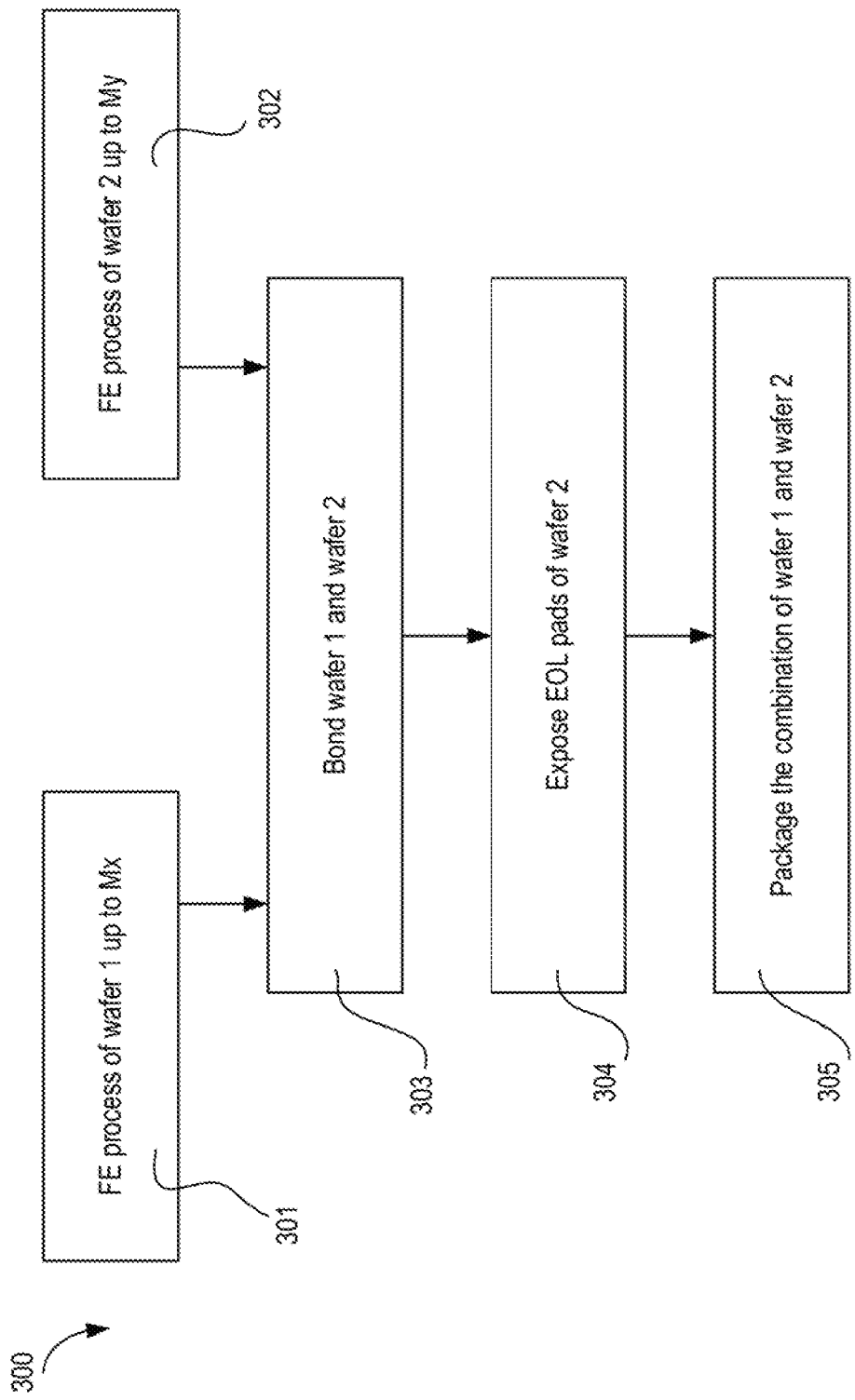
FIG. 3 illustrates a flowchart of a method to form the apparatus, according to some embodiments of the disclosure.

FIG. 3 illustrates a flowchart of a method 300 to form the apparatus, according to some embodiments. It is pointed out that those elements of FIG. 3 having the same reference numbers (or names) as the elements of any other figure can operate or function in any manner similar to that described, but are not limited to such.

Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 301, FE process operation is applied to water 1 to from active device 103 on substrate 102. The FE process also forms metal layers and vias to interconnect the active devices 103 and other nodes. For example, FE process forms a stack of layers up to Mx, where 'M' stands for metal and 'x' stands for the associated layer number.

At block 302, EOL and BE process operations are applied to wafer 2 to from EOL pads on substrate 122. The BE process also forms metal layers and vias to interconnect various nodes. For example, BE process forms a stack of layers starting from Mx and up to Mx+n, where 'M' stands for metal and 'x' stands for the associated layer number, and 'n' is a number. As such, wafer 2 includes layers which are EOL layers minus Mx+1, where "Mx" is the last layer formed on wafer 1. In some embodiments, block 302 is performed separate from block 301. For example, blocks 301 and 302 may be performed simultaneously and independently.

At block 303, bonding material is deposited on either or both of polished/cleaned surfaces of wafer 1 and wafer 2. The wafers 101 and 121 are then bonded such that their vias 110 and 120 electrically connect with one another. For example wafers 101 and 121 are pressed together with the bonding material in between to attach the two wafer surfaces. As such, vias 110 and 120 connect without causing unintended shorts with other contacts.

At block 304, substrate 122 is removed (e.g., by dry etch or CMP process) to expose the EOL pads of wafer 2 121. At block 305, a package is assembled around apparatus 100 and package bumps are electrically coupled to the EOL pads of wafer 2.

Figure 4:
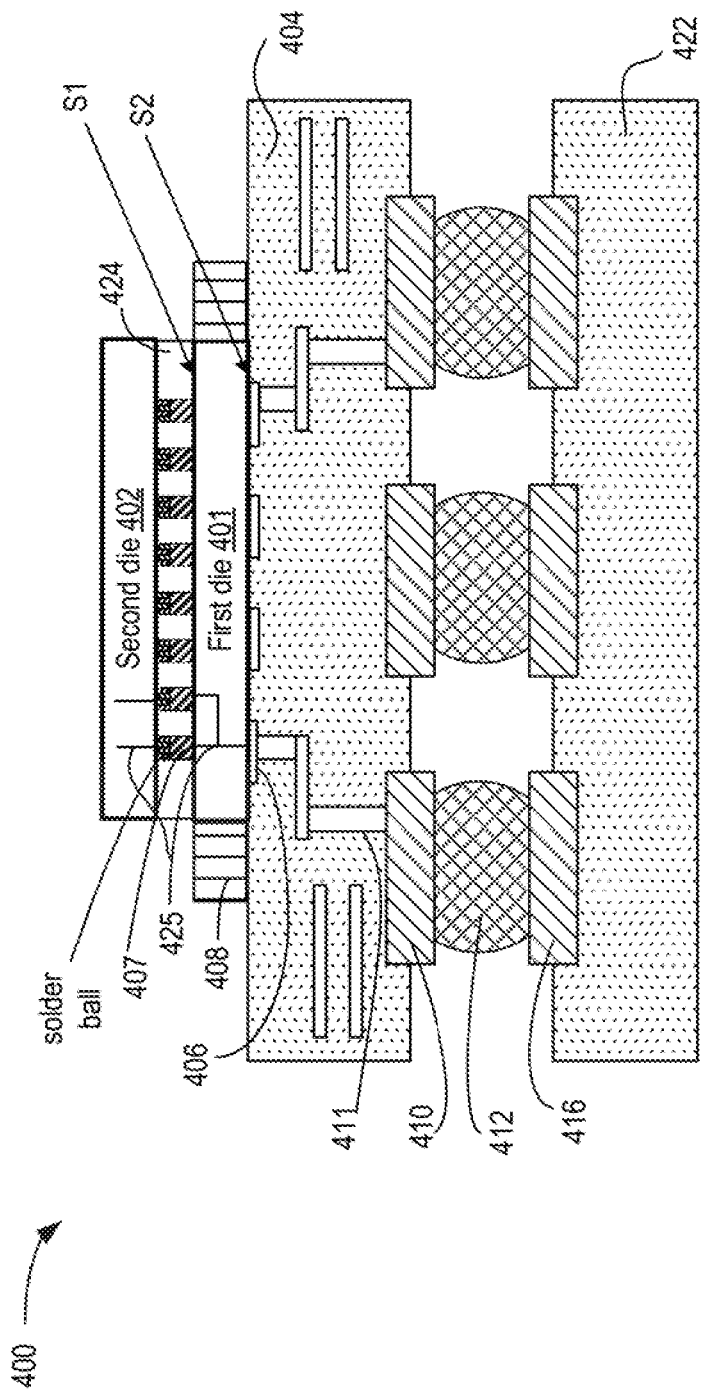
FIG. 4 illustrates cross-section of a package assembly having a processor formed by joining of the two wafers, according to some embodiments of the disclosure.

FIG. 4 illustrates cross-sectional view 400 of a package assembly having two processor dies formed by joining of the two wafers, according to some embodiments of the disclosure. It is pointed out that those elements of FIG. 4 having the same reference numbers (or names) as the elements of any other figure can operate or function in any manner similar to that described, but are not limited to such.

In some embodiments, Integrated Circuit (IC) package assembly may include First die 401, package substrate 404 (or interposer), and circuit board 422 (which may be a substrate). IC package assembly of cross-sectional view 400 is one example of a stacked die configuration in which First die 401 is coupled to package substrate 404, and Second die 402 is coupled with First die 401, in accordance with some embodiments. In some embodiments, both or at least one of First die 401 or Second die 402 is formed by the split and join process of FIGS. 2A-D where at least two wafers are separately processed and then joined together to form a single IC structure.

In some embodiments, First die 401 may have a first side S1 and a second side S2 opposite to the first side S1. TSVs may also exist in First and Second dies (401 and 402, respectively) as illustrated by vias 425, in accordance with some embodiments. In some embodiments, first side S1 may be the side of the die commonly referred to as the "inactive" or "back" side of the die. For example, first side S1 may refer to the side that exposes the EOL pads after substrate 122 is removed.

In some embodiments, second side S2 may include one or more transistors, and may be the side of the die commonly referred to as the "active" or "front" side of the die. For example, second side S2 is the side of substrate 102 which is opposite to the side having active devices 103. In some embodiments, second side S2 of First die 401 may include one or more electrical routing features 406. In some embodiments, Second die 402 may include an "active" or "front" side with one or more electrical routing features 406. In some embodiments, electrical routing features 406 may be bond pads (e.g., formed from a combination of metal bumps and solder balls).

In some embodiments, Second die 402 may be coupled to First die 401 in a front-to-back configuration (e.g., the "front" or "active" side of Second die 402 is coupled to the "back" or "inactive" side S1 of First die 401) via interconnect 407 (e.g., vias, bumps, solder balls, etc.). In some embodiments, dies may be coupled with one another in a front-to-front, back-to-back, or side-to-side arrangement. In some embodiments, one or more additional dies may be coupled with First die 401, Second die 402, and/or with package substrate interposer 404. Other embodiments may lack Second die 402. In some embodiments, First die 401 may include one or more TSVs.

In some embodiments, Second die 402 is coupled to First die 401 by die interconnects formed from a combination of bumps and solder balls. In some embodiments, inter-die interconnects may be solder bumps, copper pillars, or other electrically conductive features. In some embodiments, copper pillars 407 are formed to attach to the solder balls and thus couple First die 401 with Second die 402. In some embodiments, an interface layer 424 may be provided between First die 401 and Second die 402. In some embodiments, interface layer 424 is a solder based interconnect layer. For example, bumps coupled to First die 401 couple to solder balls which couple to bumps coupled to Second die 402. In some embodiments, interface layer 424 may be, or may include, a layer of under-fill, adhesive, dielectric, or other material. In some embodiments, interface layer 424 may serve various functions, such as providing mechanical strength, conductivity, heat dissipation, or adhesion.

In some embodiments, First die 401 and Second die 402 may be single dies formed by the split and join process of FIGS. 2A-D. In other embodiments, First die 401 and/or Second die 402 may each include two or more dies where at least one die is formed by the split and join process of FIGS. 2A-D. In some embodiments, First die 401 and/or Second die 402 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, First die 401 and/or Second die 402 may be a primary logic die. In some embodiments, First die 401 and/or Second die 402 may be configured to function as memory, an application specific circuit (ASIC), a processor, an RF IC, a baseband processor, or some combination of such functions. For example, First die 401 may include a processor and Second die 402 may include memory. In some embodiments, one or both of First die 401 and Second die 402 may be embedded in encapsulant 408. In some embodiments, encapsulant 408 can be any suitable material, such as epoxy-based build-up substrate, other dielectric/organic materials, resins, epoxies, polymer adhesives, silicones, acrylics, polyimides, cyanate esters, thermoplastics, and/or thermosets.

In some embodiments, First die 401 may be coupled to package substrate interposer 404. In some embodiments, package substrate interposer 404 may be a coreless substrate interposer. For example, package substrate interposer 404 may be a bumpless build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate interposer, but can be used for any suitable flip chip substrates.

In some embodiments, the one or more build-up layers may have material properties that may be altered and/or optimized for reliability, warpage reduction, etc. In some embodiments, package substrate interposer 404 may be composed of a polymer, ceramic, glass, or semiconductor material.

In some embodiments, layer 422 may be a Printed Circuit Board (PCB) composed of an electrically insulative material such as an epoxy laminate. For example, layer 422 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene PTFE CCL), or other polytetrafluoroethylene-based prepreg material.

Structures such as traces, trenches, and vias (which are not shown here) may be formed through the electrically insulating layers to route the electrical signals of First die 401 through the layer 422. Layer 422 may be composed of other suitable materials in other embodiments. In some embodiments, layer 422 may include other electrical devices coupled to the circuit board that are configured to route electrical signals to or from First die 401 through layer 422. In some embodiments, layer 422 may be a motherboard.

In some embodiments, a first side of package substrate interposer 404 is coupled to second surface S2 and/or electrical routing features 406 of First die 401. In some embodiments, a second opposite side of package substrate interposer 404 is coupled to layer 422 by package interconnects 412. In some embodiments, package interconnects 412 may couple electrical routing features 410 disposed on the second side of package substrate interposer 404 to corresponding electrical routing features 416 on layer 422. In some embodiments, non-circle TSV landing pads 410 are for landing one or more TSVs 411 and coupling them to solder bumps 412.

In some embodiments, package substrate interposer 404 may have electrical routing features formed therein to route electrical signals between First die 401 (and/or the Second die 402) and layer 422 and/or other electrical components external to the IC package assembly. In some embodiments, package interconnects 412 and die interconnects 406 include any of a wide variety of suitable structures and/or materials including, for example, bumps, pillars or balls formed using metals, alloys, solderable material, or their combinations. In some embodiments, electrical routing features 410 may be arranged in a ball grid array ("BGA") or other configuration.

Figure 5:
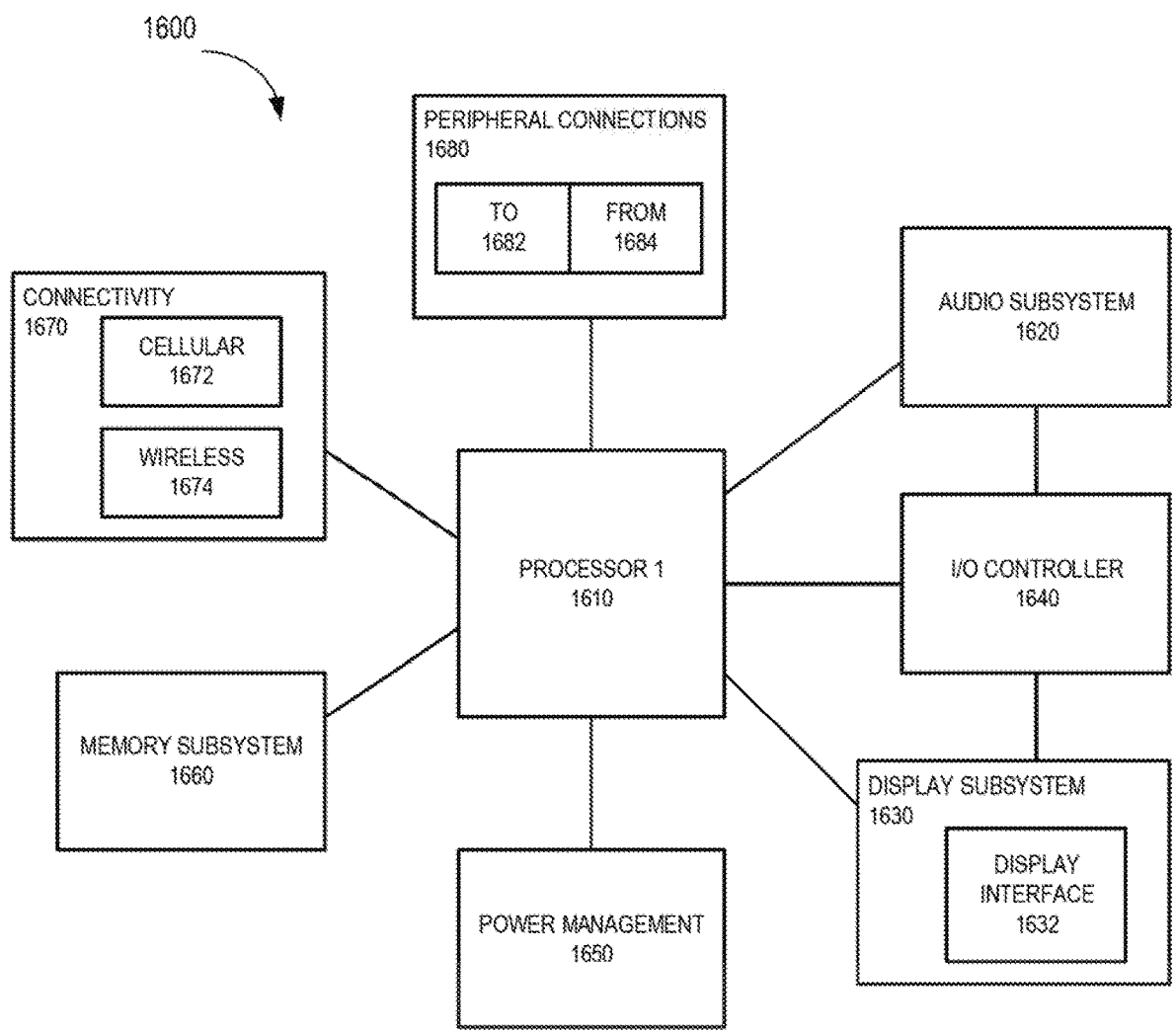
FIG. 5 illustrates a smart device or a computer system or a SoC (System-on-Chip) formed by joining of at least two wafers, according to some embodiments.

FIG. 5 illustrates a smart device or a computer system or a SoC (System-on-Chip) formed by joining of at least two wafers, according to some embodiments. It is pointed out that those elements of FIG. 5 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BRAIDS, CMOS, etc., may be used without departing from the scope of the disclosure.

FIG. 5 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 and network interface within 1670 such as a wireless interface so that a system embodiment may be incorporated into a wireless device, for example, cell phone or personal digital assistant. In some embodiments, at least one (or all) blocks of computing device 1600 are formed by the split and join process of various embodiments.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMS, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670, Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, some components may be formed on wafer 1 while other components may be formed on wafer 2, and then the two wafers can be joined or bonded together as described with reference to various embodiments. In some embodiments, all active devices are formed in wafer 1 while wafer 2 has most of the EOL layers.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. Various embodiments here can be can be combined with any of the other embodiments thereby allowing various combinations.

Example 1 is an apparatus which comprises: a substrate; one or more active devices adjacent to the substrate; a first set of one or more layers to interconnect the one or more active devices; a second set of one or more layers; and a layer adjacent to one of the layers of the first and second sets, wherein the layer is to bond the one of the layers of the first and second sets.

Example 2 includes all features of example 1, wherein the substrate, the one or more active devices, and the first set of one of more layers are formed on a first wafer, and wherein the second set of one or more layers is formed on a second wafer.

Example 3 according to any one of examples 1 to 2, wherein the substrate includes one of: bulk silicon or silicon-on-insulator (SOI).

Example 4 includes all features of example 3, wherein the bulk silicon includes device quality Epi.

Example 5 according to any one of examples 1 to 2, wherein the layer to bond includes at least one of a dielectric or a metal.

Example 6 includes all features of example 5, wherein the dielectric includes one of oxygen, carbon-doped oxide, polymer, or glue.

Example 7 according to any one of examples 5 or 6, wherein the metal includes one of: Cu, Ni, Co, W, or Al.

Example 8 is a method which comprises: forming a substrate; forming one or more active devices adjacent to the substrate; forming a first set of one or more layers to interconnect the one or more active devices; forming a second set of one or more layers; and forming a layer adjacent to one of the layers of the first and second sets, wherein the layer is to bond the one of the layers of the first and second sets.

Example 9 includes all features of example 8, wherein the substrate includes one of: bulk silicon or silicon-on-insulator (SOI).

Example 10 includes all features of example 9, wherein the bulk silicon includes device quality Epi.

Example 11 according to any of the preceding method examples, wherein the layer to bond includes at least one of a dielectric or a metal.

Example 12 includes all features of example 11, wherein the dielectric includes one of: oxygen, carbon-doped oxide, polymer, or glue.

Example 13 includes all features of example 8, wherein the metal includes one of: Cu, Ni, Co, W, or Al.

Example 14 is according to any of examples 8 to 13, wherein the substrate, the one or more active devices, and the first set of one of more layers are formed on a first wafer, and wherein the second set of one or more layers is formed on a second wafer.

Example 15 includes all features of example 14, wherein the method of example 15 comprises dry etching a surface of the second wafer such that pads are exposed.

Example 16 includes all features of example 15, wherein the method of example 16 comprises: forming solder bumps on the exposed pads.

Example 17 is a method which comprises: forming, on a first wafer, one or more transistors adjacent to a substrate; forming a first set of one or more layers to interconnect the one or more transistors; forming, on a second wafer, a second set of one or more layers; and bonding the first wafer the second wafer such that one of the layers of the first and second sets couple with one another.

Example 18 includes all features of example 17, wherein the method of example 18 comprises: dry etching a surface of the second wafer such that pads are exposed.

Example 19 includes all features of example 17, wherein bonding the first wafer with the second wafer comprises applying a layer which includes at least one of a dielectric or a metal.

Example 20 includes all features of example 19, wherein the dielectric includes one of: oxygen, carbon-doped oxide, polymer, or glue.

Example 21 according to any one of examples 19 or 20, wherein the metal includes one of: Cu, Ni, Co, Al, or W.

Example 22 is an apparatus which comprises: one or more transistors adjacent to a substrate of a first wafer; a first set of one or more layers to interconnect the one or more transistors, wherein the first set of one or more layers are part of the first wafer; a second set of one or more layers of a second wafer; and a layer adjacent to one of the layers of the first and second sets, wherein the layer is to bond the one of the layers of the first and second sets from the first and second wafers, respectively.

Example 23 includes all features of example 22, wherein the substrate includes one of: bulk silicon or silicon-on-insulator (SOI).

Example 24 includes all features of example 22, wherein the bulk silicon includes device quality Epi.

Example 25 according to any one of examples 22 to 24, wherein the layer to bond includes at least one of a dielectric or a metal.

Example 26 includes all features of example 25, wherein the dielectric includes one of: oxygen, carbon-doped oxide, polymer, or glue.

Example 27 includes all features of example 25, wherein the metal includes one of: Cu, Ni, Co, W, or Al.

Example 28 is a system which comprises: a memory, a processor coupled to the memory, the processor having an apparatus according to any one of apparatus examples 1 to 7 or apparatus examples 22 to 27; and a wireless interface to allow the processor to communicate with another device.

Example 29 is an apparatus which comprises: one or more transistors adjacent to a substrate of a first wafer; means for interconnecting a first set of one or more layers to the one or more transistors, wherein the first set of one or more layers are part of the first wafer; a second set of one or more layers of a second wafer; and means for bonding the one of the layers of the first and second sets from the first and second wafers, respectively.

Example 30 includes all features of example 29, wherein the substrate includes one of bulk silicon or silicon-on-insulator (SOI).

Example 31 includes all features of example 29, wherein the bulk silicon includes device quality Epi.

Example 32 according to any one of examples 29 to 31, wherein the means for bonding includes at least one of a dielectric or a metal.

Example 33 includes all features of example 32, wherein the dielectric includes one of: oxygen, carbon-doped oxide, polymer, or glue.

Example 34 includes all features of example 32, wherein the metal includes one of: Cu, Ni, Co, W, or Al.

Example 28 is a system which comprises: a memory a processor coupled to the memory, the processor having an apparatus according to any one of apparatus examples 29 to 34; and a wireless interface to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a substrate;
    one or more active devices adjacent to the substrate;
    a first set of one or more layers to interconnect the one or more active devices, wherein the one or more layers of the first set includes a first layer of a first thickness and a second layer of a second thickness greater than the first thickness, wherein the first layer is closer to the substrate than the second layer;
    a second set of one or more layers, wherein the one or more layers of the second set includes a third layer of a third thickness and a fourth layer of fourth thickness greater than the third thickness; and
    a layer adjacent to one of the layers of the first and second sets, wherein the layer is to bond the one of the layers of the first and second sets, wherein the layer to bond includes a metal, wherein the third layer is closer to the layer to bond than the fourth layer, and wherein the second layer is closer to the layer to bond than the first layer.

2. The apparatus of claim 1, wherein the substrate, the one or more active devices, and the first set of one of more layers are on a first wafer, and wherein the second set of one or more layers is on a second wafer.

3. The apparatus of claim 2, wherein the substrate includes one of: bulk silicon or silicon-on-insulator (SOI).

4. The apparatus of claim 3, wherein the bulk silicon includes device quality Epi.

5. The apparatus of claim 1, wherein the metal includes one of: Cu, Ni, Co, W, or Al.

6. A method comprising:
    forming a substrate;
    forming one or more active devices adjacent to the substrate;
    forming a first set of one or more layers to interconnect the one or more active devices;
    forming a second set of one or more layers;
    forming a layer adjacent to one of the layers of the first and second sets, wherein the layer is to bond the one of the layers of the first and second sets, wherein the substrate, the one or more active devices, and the first set of one or more layers are on a first wafer, and wherein the second set of one or more layers is on a second wafer;
    dry etching a surface of the second wafer such that pads are exposed; and
    forming solder bumps on the exposed pads.

7. The method of claim 6, wherein the substrate includes one of: bulk silicon or silicon-on-insulator (SOI).

8. The method of claim 7, wherein the bulk silicon includes device quality Epi.

9. The method of claim 6, wherein the layer to bond includes at least one of a dielectric or a metal.

10. The method of claim 9, wherein the dielectric includes one of: oxygen, carbon-doped oxide, polymer, or glue.

11. The method of claim 9, wherein the metal includes one of: Cu, Ni, Co, W, or Al.

12. A system comprising: a memory; a processor coupled to the memory, the processor having an apparatus which includes:

a substrate;

one or more active devices adjacent to the substrate;

a first set of one or more layers to interconnect the one or more active devices wherein the one or more layers of the first set includes a first layer of a first thickness and a second layer of a second thickness greater than the first thickness, wherein the first layer is closer to the substrate than the second layer;

a second set of one or more layers, wherein the one or more layers of the second set includes a third layer of a third thickness and a fourth layer of fourth thickness greater than the third thickness; and a layer adjacent to one of the layers of the first and second sets, wherein the layer is to bond the one of the layers of the first and second sets, wherein the layer to bond includes a metal, wherein the third layer is closer to the layer to bond than the fourth layer, and wherein the second layer is closer to the layer to bond than the first layer; and a wireless interface to allow the processor to communicate with another device.

13. The system of claim 12, wherein the substrate, the one or more active devices, and the first set of one of more layers are on a first wafer, and wherein the second set of one or more layers is on a second wafer.

14. The system of claim 13, wherein the substrate includes one of: bulk silicon or silicon-on-insulator (SOI).

15. The system of claim 14, wherein the bulk silicon includes device quality Epi.

16. The system of claim 12, wherein the metal includes one of: Cu, Ni, Co, W, or Al.

* * * * *